US012782435B2

(12) United States Patent
Wang et al.

(10) Patent No.: US 12,782,435 B2
(45) Date of Patent: Nov. 3, 2026

(54) CHIPLET, CHIP, AND CHIP DEBUGGING METHOD

(71) Applicant: SANECHIPS TECHNOLOGY CO., LTD., Shenzhen (CN)

(72) Inventors: Xiyu Wang, Shenzhen (CN); Dujiao Zhang, Shenzhen (CN); Yang Yang, Shenzhen (CN)

(73) Assignee: SANECHIPS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 19/303,608

(22) Filed: Aug. 19, 2025

(65) Prior Publication Data

US 2026/0063711 A1 Mar. 5, 2026

(30) Foreign Application Priority Data

Sep. 2, 2024 (CN) ........................ 202411216525.9

(51) Int. Cl.
*G01R 31/317* (2006.01)

(52) U.S. Cl.
CPC .............................. *G01R 31/31717* (2013.01)

(58) Field of Classification Search
CPC ........ G01R 31/31717; G01R 31/31723; G01R 31/318513; G01R 31/31705; G06F 11/263; G06F 11/273; G06F 13/4068; G06F 13/4247
USPC .......................................................... 714/734
See application file for complete search history.

(56) References Cited

U.S. PATENT DOCUMENTS 11,488,935 B1 11/2022 Zaman et al.
2004/0078685 A1 * 4/2004 Glass .................. G06F 11/3656 714/38.14
2005/0223298 A1 * 10/2005 Higuchi .............. G06F 11/3648 714/E11.171

(Continued)

FOREIGN PATENT DOCUMENTS

CN 117785783 A 3/2024
CN 118519939 A 8/2024

OTHER PUBLICATIONS

Chinese Notification to Grant Patent Right for Invention (with English translation) for corresponding Application No. CN 202411216525.9, issued Nov. 23, 2024, 3 pages.

(Continued)

*Primary Examiner* — James C Kerveros
(74) *Attorney, Agent, or Firm* — Dority & Manning, P.A.

(57) ABSTRACT

The present disclosure provides a chiplet, including: an inter-chiplet interconnect interface connected to one other chiplet, a selection module, and a processing module; the inter-chiplet interconnect interface receives second debugging information from the other chiplet; the selection module receives at least one piece of debugging information of the second debugging information, and send the at least one piece of debugging information to the processing module; and the processing module forwards, if the at least one piece of debugging information is debugging information for debugging of the chiplet, the at least one piece of debugging information within the chiplet for the debugging of the chiplet, and sends, if the at least one piece of debugging information is debugging information for debugging of the other chiplet, the at least one piece of debugging information to the inter-chiplet interconnect interface.

19 Claims, 5 Drawing Sheets

(56) References Cited

U.S. PATENT DOCUMENTS

| | | | | |
|---|---|---|---|---|
| 2015/0268302 | A1* | 9/2015 | Hopkins | G01R 31/3177 714/724 |
| 2021/0173004 | A1* | 6/2021 | Perley | G06F 13/4027 |
| 2021/0389371 | A1* | 12/2021 | Liew | G01R 31/31705 |
| 2024/0329129 | A1* | 10/2024 | Muthrasanallur | G01R 31/31705 |
| 2025/0168115 | A1 | 5/2025 | Zhang | |

OTHER PUBLICATIONS

Chinese First Office Action (with English translation) for corresponding Application No. CN 202411216525.9, dated Oct. 9, 2024, 24 pages.

* cited by examiner

CHIPLET, CHIP, AND CHIP DEBUGGING METHOD

CROSS REFERENCE TO RELATED APPLICATIONS

The present disclosure claims the priority to Chinese Patent Application No. 202411216525.9 entitled "CHIPLET, CHIP, AND CHIP DEBUGGING METHOD" and filed on Sep. 2, 2024, the contents of which are incorporated herein by reference in their entirety.

TECHNICAL FIELD

The present disclosure relates to the field of semiconductor technologies, and in particular, to a chiplet, a chip, and a chip debugging method.

BACKGROUND

With development of electronic technologies, chips are designed more and more complex, and a single chip cannot meet all functional requirements, so that a plurality of chips needs to operate together to achieve more complex functions. Chip debugging is an important step during program development and chip design, and aims to identify, isolate, and repair errors in programs or chips.

In some related technologies, debugging of the plurality of chips is performed by using a "Joint Test Action Group (JTAG) daisy chain", each chip and chips adjacent thereto are sequentially connected in series via JTAG interfaces to form a chain, and all chips are debugged just through only the JTAG interfaces, such that once a single point of failure occurs (i.e., any chip or a JTAG interface thereof in the chain fails), the debugging of all chips in the whole chain may be affected. In addition, a length of the JTAG daisy chain is limited by physical and electrical characteristics, and an excessively long chain may affect signal integrity, for example, the excessively long chain may cause signal attenuation and noise interference, so that scalability of a quantity of the chips is limited, and moreover, wiring for the JTAG interface of each chip in the chain is needed to ensure a correct signal path, which may increases complexity and cost of Printed Circuit Board (PCB) wiring in complex design of the plurality of chips and limits a packaging form.

SUMMARY

The present disclosure provides a chiplet, a chip, and a chip debugging method.

In a first aspect, an embodiment of the present disclosure provides a chiplet, including: at least one inter-chiplet interconnect interface configured to be connected to at least one other chiplet to communicate with the at least one other chiplet, a selection module connected to the at least one inter-chiplet interconnect interface, and a processing module connected to the selection module, wherein: the at least one inter-chiplet interconnect interface is configured to receive second debugging information from the at least one other chiplet; the selection module is configured to receive at least one piece of debugging information of the second debugging information from the at least one inter-chiplet interconnect interface, and send the at least one piece of debugging information to the processing module; and the processing module is configured to forward, in a case where it is determined that the at least one piece of debugging information is debugging information for debugging of the chiplet, the at least one piece of debugging information within the chiplet for the debugging of the chiplet, and send, in a case where it is determined that the at least one piece of debugging information is debugging information for debugging of the at least one other chiplet, the at least one piece of debugging information to the at least one inter-chiplet interconnect interface, so as to send the at least one piece of debugging information to the corresponding at least one other chiplet via the at least one inter-chiplet interconnect interface.

In a second aspect, an embodiment of the present disclosure provides a chip, including a first chiplet and one or more second chiplets, wherein: the first chiplet includes one or more inter-chiplet interconnect interfaces respectively corresponding to each of the second chiplets, each of the second chiplets includes a respective inter-chiplet interconnect interface, the respective inter-chiplet interconnect interface of each of the second chiplets is connected to a corresponding inter-chiplet interconnect interface of the first chiplet for communication between the first chiplet and each of the second chiplets; the chip includes an external interface located on the first chiplet, and the external interface is configured to be connected to an external debugging device for receiving first debugging information from the external debugging device; the first chiplet further includes a selection module and a processing module, wherein: the selection module of the first chiplet is connected to the external interface, and is configured to receive the first debugging information and send the first debugging information to the processing module of the first chiplet; the processing module of the first chiplet is connected to the selection module of the first chiplet and the one or more inter-chiplet interconnect interfaces of the first chiplet, and is configured to forward, in a case where it is determined that the first debugging information is debugging information for debugging of the first chiplet, the first debugging information within the first chiplet for the debugging of the first chiplet, and send, in a case where it is determined that the first debugging information is debugging information for debugging of one second chiplet of the one or more second chiplets, the first debugging information to an inter-chiplet interconnect interface corresponding to the one second chiplet of the one or more inter-chiplet interconnect interfaces of the first chiplet, so as to send the first debugging information to the one second chiplet for the debugging of the one second chiplet.

In a third aspect, an embodiment of the present disclosure provides a chip debugging method applied to the chip provided in the second aspect or in any possible embodiment in the second aspect, and the method includes: receiving the first debugging information from the external debugging device by the external interface of the chip on the first chiplet; receiving the first debugging information from the external interface and sending the first debugging information to the processing module of the first chiplet by the selection module of the first chiplet; and forwarding, in a case where it is determined that the first debugging information is the debugging information for the debugging of the first chiplet, the first debugging information within the first chiplet for the debugging of the first chiplet, and sending, in a case where it is determined that the first debugging information is the debugging information for the debugging of the one second chiplet of the one or more second chiplets, the first debugging information to the inter-chiplet interconnect interface corresponding to the one second chiplet of the one or more inter-chiplet interconnect interfaces of the first chiplet, by the processing module of the first chiplet, so as to send the first debugging information to the one second chiplet for the debugging of the one second chiplet.

In a fourth aspect, an embodiment of the present disclosure provides a computer readable medium having stored thereon a computer program which, when executed by a processor, implements the third aspect and any possible embodiment in the third aspect.

In the embodiments of the present disclosure, the chiplet may receive the debugging information from the at least one other chiplet via the at least one inter-chiplet interconnect interface connected to the at least one other chiplet, and interaction of the debugging information between the chiplets which are in communication connection may be realized through the at least one inter-chiplet interconnect interface, which expands an acquisition manner of the debugging information and improves transmission reliability of the debugging information, so that an influence of a single point of failure may be reduced or even eliminated. In addition, by adopting the method provided in the present disclosure, a "JTAG daisy chain" is not needed, so that a problem of signal integrity may be avoided, additional wiring dedicated to a debugging path is also not needed, and complexity and cost of the wiring may be reduced; and interconnection and debugging of the chiplets in any number and any topological structure may be supported theoretically, and thus high expandability may be realized.

BRIEF DESCRIPTION OF DRAWINGS

In the drawings for embodiments of the present disclosure.

DETAIL DESCRIPTION OF EMBODIMENTS

Figure 1:
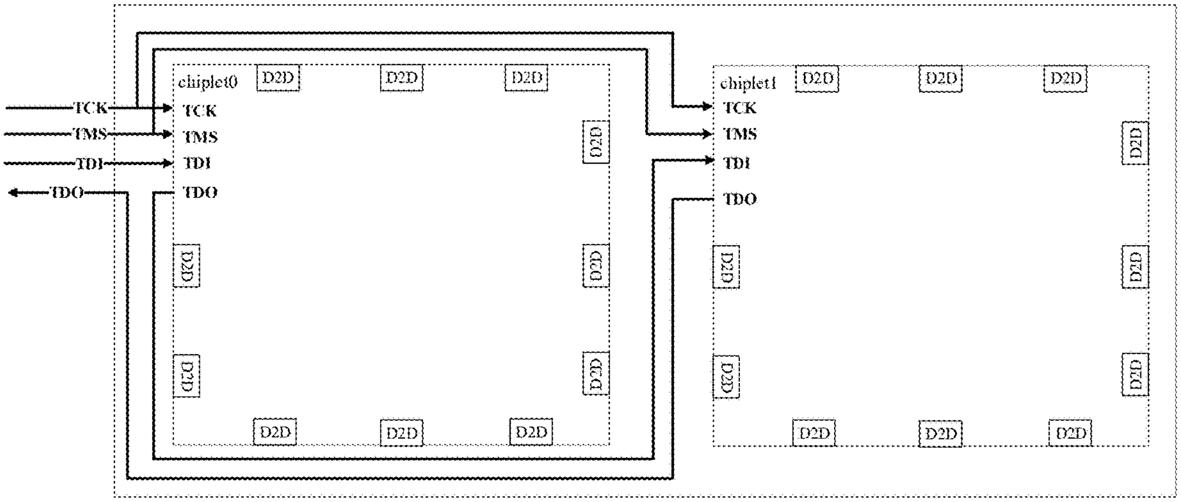
FIG. 1 is a schematic diagram of debugging by using a "JTAG daisy chain" according to an embodiment of the present disclosure.

In order to enable those of ordinary skill in the art to better understand technical solutions of the present disclosure, a chiplet, a chip, and a chip debugging method provided according to embodiments of the present disclosure are described in detail below with reference to the drawings.

The present disclosure will be described more fully below with reference to the drawings, but the illustrated embodiments may be implemented in different forms, and the present disclosure should not be interpreted as being limited to the embodiments described below. Rather, the embodiments are provided to make the present disclosure thorough and complete, and are intended to enable those of ordinary skill in the art to fully understand the scope of the present disclosure.

The drawings for the embodiments of the present disclosure are intended to provide a further understanding of the embodiments of the present disclosure and constitute a part of the specification. Together with detailed embodiments of the present disclosure, the drawings are used to explain the present disclosure, but do not constitute any limitation to the present disclosure. The above and other features and advantages will become more apparent to those of ordinary skill in the art from descriptions of the detailed embodiments with reference to the drawings.

All embodiments of the present disclosure and features therein may be combined with each other if no conflict is incurred.

Terms used in the present disclosure are merely used to describe specific embodiments, and are not intended to limit the present disclosure. The term "and/or" used in the present disclosure includes any and all combinations of one or more associated listed items. The terms "a", "an", "one" and "the" used in the present disclosure which indicate a singular form are intended to include a plural form, unless expressly stated in the context. The terms "include" and "be made of" used in the present disclosure indicate presence of described feature, integer, operation, element and/or component, but do not exclude presence or addition of one or more other features, integers, operations, elements, components and/or combinations thereof.

Unless otherwise defined, all terms (including technical and scientific terms) used in the present disclosure have the same meaning as commonly understood by those of ordinary skill in the art. It should be further understood that terms, such as those defined in commonly used dictionaries, should be interpreted as including a meaning that is consistent with a meaning in a context of related technologies and the background of the present disclosure, and should not be interpreted as including a meaning in an idealized or overly formal sense unless expressly so defined herein.

In a conventional System on Chip (SoC), different functional modules such as a processor core, a memory controller, and an Input/Output (I/O) interface are integrated on a single chip. A SoC adopting a chiplet architecture is an emerging SoC, the SoC adopting the chiplet architecture is referred to as a chiplet SoC in the present disclosure, the chiplet SoC adopts a chiplet technology to design a plurality of small and independent functional modules into independent chiplets, and all chiplets may be connected via Die-to-Die (D2D) high-speed interconnect interfaces to form a complete SoC.

In design of a baseband chip and a CPU chip of a server, a chiplet SoC architecture may not only significantly improve performance and efficiency, but also enhance flexibility and expandability of the design, reduce manufacturing cost and complexity, and optimize heat management. These advantages make the chiplet SoC architecture an indispensable key technology in the design of the baseband chip and the CPU chip of the server.

With development of semiconductor technologies, the chiplet architecture is increasingly widely applied in various types of chip design fields due to advantages of the chiplet architecture in various aspects. The chiplet architecture is not limited to be applied to the CPU chip, and may be also applied to other types of chips, such as a Graphics Processing Unit (GPU) chip, a power management chip, and a sensor chip. A chip adopting the chiplet architecture is referred to as a chiplet-architecture chip in the present disclosure.

In some related technologies, the chiplet-architecture chip is debugged by using a "JTAG daisy chain", in this debugging manner, each chiplet is provided with an independent JTAG interface, and the JTAG interface of each chiplet and the JTAG interfaces of the adjacent chips are sequentially connected in series to form a chain, and all chips in the chiplet-architecture chip are allowed to be debugged just through the JTAG interfaces. Referring to FIG. 1 which is a schematic diagram of debugging by using the "JTAG daisy chain" according to an embodiment of the present disclosure, but FIG. 1 is merely a schematic diagram and does not constitute any limitation to an application scenario of the technical solutions provided in the present disclosure. FIG. 1 illustrates a debugging process by taking a case where the chiplet-architecture chip includes two chiplets as an example, a Test Data In (TDI) pin of an external JTAG of the chiplet-architecture chip is connected to one chiplet, and then a Test Data Out (TDO) pin of the one chiplet is connected to a TDI pin of a next chiplet until a TDO pin of the last chiplet is led out from the chiplet-architecture chip. In this way, once a single point of failure occurs (i.e., any chiplet or the JTAG interface thereof in the chain fails), debugging of all chiplets in the chain may be affected, the single point of failure may increase complexity of debugging and fault diagnosis and limit reliability of the debugging of the chiplet-architecture chip.

In view of the above, the embodiments of the present disclosure provide a chiplet, a chip, and a chip debugging method, which will be described in detail below with reference to the drawings.

Figure 2:
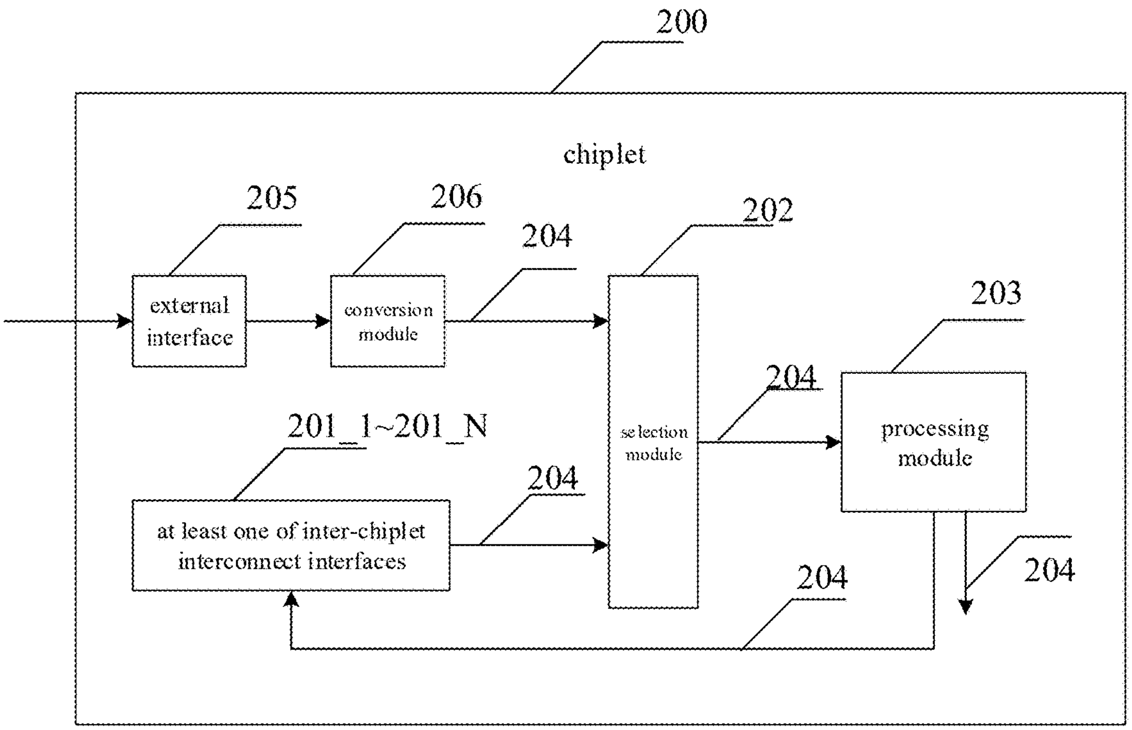
FIG. 2 is a schematic structural diagram of a chiplet according to an embodiment of the present disclosure.

In a first aspect, referring to FIG. 2 which is a schematic structural diagram of a chiplet according to an embodiment of the present disclosure. A chiplet 200 is applicable to various types of chiplet-architecture chips, such as a SoC adopting the chiplet architecture. The chiplet 200 includes at least one inter-chiplet interconnect interface 201_1 to 201_N, a selection module 202, and a processing module 203.

In the embodiments of the present disclosure, 201_*i* denotes any inter-chiplet interconnect interface, where a value of i is from 1 to N, and N is an integer greater than or equal to 1.

In some embodiments, the selection module 202, the at least one inter-chiplet interconnect interface 201_1 to 201_N, and the processing module 203 are connected to each other through a bus 204.

In some embodiments, the bus 204 may be a Debug Module Interface (DMI) line. For example, the DMI line may be an Advanced Peripheral Bus (APB) of an Advanced Reduced Instruction-Set Computer (RISC) Machine (ARM) or a TileLink line of SiFive.

In the embodiments of the present disclosure, the at least one inter-chiplet interconnect interface 201_1 to 201_N is configured to be connected to at least one other chiplet to communicate with the at least one other chiplet, the selection module 202 is connected to the at least one inter-chiplet interconnect interface 201_1 to 201_N, and the processing module 203 is connected to the selection module 202.

In the embodiments of the present disclosure, the chiplet 200 and other chiplets may be connected via the inter-chiplet interconnect interfaces for communication, the term "connect/connected" here indicates both direct connection and indirect connection, and the chiplet 200 and the other chiplets being connected via the inter-chiplet interconnect interfaces for communication may include: a case where the chiplet 200 is directly connected to another chiplet via an inter-chiplet interconnect interface to communicate with the another chiplet, or a case where the chiplet 200 is indirectly connected to another chiplet via an inter-chiplet interconnect interface through one or more intermediate chiplets to communicate with the another chiplet.

In the embodiments of the present disclosure, the other chiplets refer to chiplets other than the chiplet 200, and are distinguished from the chiplet 200.

In the embodiments of the present disclosure, the at least one inter-chiplet interconnect interface 201_1 to 201_N is configured to receive second debugging information from the at least one other chiplet. In an example, each inter-chiplet interconnect interface 201_*i* may be correspondingly connected to one other chiplet, and may be configured to receive the second debugging information from the corresponding one other chiplet.

In the embodiments of the present disclosure, the selection module 202 is configured to receive at least one piece of debugging information of the second debugging information from the at least one inter-chiplet interconnect interface 201_1 to 201_N, and send the at least one piece of debugging information to the processing module 203.

In the embodiments of the present disclosure, the selection module 202 may be a multiplexer (MUX).

In some embodiments, the debugging information includes debugging data and/or a debugging instruction.

In the embodiments of the present disclosure, the processing module 203 is configured to forward, in a case where it is determined that the at least one piece of debugging information is debugging information for debugging of the chiplet 200, the at least one piece of debugging information within the chiplet 200 for the debugging of the chiplet 200, and send, in a case where it is determined that the at least one piece of debugging information is debugging information for debugging of the at least one other chiplet, the at least one piece of debugging information to the at least one inter-chiplet interconnect interface 201_1 to 201_N, so as to send the at least one piece of debugging information to the corresponding at least one other chiplet via the at least one inter-chiplet interconnect interface 201_1 to 201_N.

In the embodiments of the present disclosure, the processing module 203 may forward the at least one piece of debugging information within the chiplet 200 through the bus 204 for the debugging of the chiplet 200.

In the embodiments of the present disclosure, the processing module may be a DMI Interconnect (DMI_IC) module.

In the embodiments of the present disclosure, the chiplet may receive the debugging information from the at least one other chiplet via the at least one inter-chiplet interconnect interface connected to the at least one other chiplet, and interaction of the debugging information between the chiplets which are in communication connection may be realized through the at least one inter-chiplet interconnect interface, which expands an acquisition manner of the debugging information and improves transmission reliability of the debugging information, so that an influence of a single point of failure may be reduced or even eliminated. In addition, by adopting the method provided in the present disclosure, the "JTAG daisy chain" is not needed, so that a problem of signal integrity may be avoided, additional wiring dedicated to a debugging path is also not needed, and complexity and cost of the wiring may be reduced; and interconnection and debugging of chiplets in any number and any topological structure may be supported theoretically, and thus high expandability may be realized.

In some embodiments, the processing module 203 is configured to determine, in a case where it is determined that the at least one piece of debugging information is debugging information for debugging of a target chiplet of the at least one other chiplet, an inter-chiplet interconnect interface corresponding to the target chiplet of the at least one inter-chiplet interconnect interface 201_1 to 201_N of the chiplet 200 according to configuration information, and send the at least one piece of debugging information to the corresponding inter-chiplet interconnect interface, the configuration information includes connection relationship information of the chiplet 200 and the at least one other chiplet and/or information generated based on the connection relationship information.

In the embodiments of the present disclosure, the connection relationship information of the chiplets may be configured to determine a connection path between the chiplets. For example, the connection relationship information of the chiplets may include direct connection information or indirect connection information, the direct connection information may include inter-chiplet interconnect interface information of directly connected chiplets, and the indirect connection information may include inter-chiplet interconnect interface information of chiplets on the connection path.

In some embodiments, each inter-chiplet interconnect interface 201_*i* is connected to a corresponding other chiplet, and includes at least two bidirectional transmission interface units; and each of the bidirectional transmission interface units is configured to receive the second debugging information from the corresponding other chiplet, and is further configured to transmit the at least one piece of debugging information to the corresponding other chiplet.

In the embodiments of the present disclosure, the bidirectional transmission interface units may be bidirectional D2D high-speed interconnect interfaces. A quantity of the bidirectional D2D high-speed interconnect interfaces may be determined according to an actual data transmission bandwidth, and the larger the data transmission bandwidth, the more the quantity of the bidirectional D2D high-speed interconnect interfaces determined to be used. In this way, when any chiplet or the JTAG interface thereof in the chiplet-architecture chip fails, the debugging information may be acquired via the inter-chiplet interconnect interfaces of other normal chiplets; and meanwhile, when a part of the bidirectional D2D high-speed interconnect interfaces is blocked, the debugging information may be still acquired via other unblocked bidirectional D2D high-speed interconnect interfaces, so that reliability of the debugging path is greatly improved, and the influence of the single point of failure on the debugging of the chiplet-architecture chip may be reduced or even eliminated.

In the embodiments of the present disclosure, the bidirectional D2D high-speed interconnect interfaces are interconnect modules with high bandwidth and low latency between the chiplets, and may support a chiplet high-speed interconnect protocol, e.g., the Universal Chiplet Interconnect Express (UCIe).

In the embodiments of the present disclosure, the bidirectional D2D high-speed interconnect interfaces may merely include data interfaces, or may include both data interfaces and signaling interfaces. In a case where the bidirectional D2D high-speed interconnect interfaces merely include the data interfaces, the debugging data and the debugging instruction may be transmitted by multiplexing of the data interfaces. In a case where the bidirectional D2D high-speed interconnect interfaces include both the data interfaces and the signaling interfaces, the data interfaces are configured to transmit the debugging data, and the signaling interfaces are configured to transmit the debugging instruction. In this way, both the debugging data and the debugging instruction may be transmitted via the bidirectional D2D high-speed interconnect interfaces, that is, a data path between the chiplets is used as the debugging path between the chiplets, so that no additional wiring dedicated to the debugging path is needed, complexity and cost of the wiring in the chiplet-architecture chip may be reduced, and packaging form and requirement may be simplified.

In some embodiments, the chiplet 200 further includes an external interface 205 configured to be connected to an external debugging device, and the selection module 202 is connected to the external interface 205. The external interface 205 is configured to receive first debugging information from the external debugging device; the selection module 202 is configured to receive at least one piece of debugging information of the second debugging information from the at least one inter-chiplet interconnect interface 201_1 to 201_N and the first debugging information from the external interface 205, and send the at least one piece of debugging information to the processing module 203.

In the embodiments of the present disclosure, the first debugging information is debugging information which is sent by the external debugging device and is not forwarded by the other chiplets; and the second debugging information is debugging information forwarded by the other chiplets.

In some embodiments, the selection module 202 includes at least one second port configured to receive the second debugging information, each of the second ports corresponds to one other chiplet, each other chiplet is connected to one or more inter-chiplet interconnect interfaces of the at least one inter-chiplet interconnect interface 201_1 to 201_N of the chiplet 200, and the one or more inter-chiplet interconnect interfaces are connected to a second port corresponding to each other chiplet for sending the second debugging information from the corresponding other chiplet to the corresponding second port. In a possible example, the selection module 202 may further include a first port for receiving the first debugging information.

In the embodiments of the present disclosure, the chiplet-architecture chip may merely package one group of inter-chip interconnect interfaces, any chiplet of the chiplet-architecture chip may be accessed through the inter-chip interconnect interfaces, and interaction of the debugging information between adjacent chiplets may be realized through the inter-chip interconnect interfaces between the chiplets, so as to achieve debugging of all chiplets.

In some embodiments, the external interface 205 is any one of a JTAG interface, a Universal Serial Bus (USB) interface, an Ethernet interface, a Serial Peripheral Interface (SPI), or a Universal Asynchronous Receiver-Transmitter (UART) interface.

In some embodiments, the chiplet 200 further includes a conversion module 206, the selection module 202 is connected to the external interface 205 via the conversion module 206, and the conversion module 206 is connected to the selection module 202 through the bus 204; and the conversion module 206 is configured to receive the first debugging information from the external interface 205, convert the first debugging information into a format suitable for transmission through the bus 204, and send the converted first debugging information to the selection module 202 through the bus 204.

In an example, the external interface 205 is the JTAG interface, the bus 204 is the DMI line, the first debugging information received by the external interface 205 has a JTAG interface protocol format, and the conversion module 206 is configured to convert the first debugging information received by the external interface 205 from the JTAG interface protocol format into a DMI protocol format, and send the converted first debugging information to the selection module 202 through the bus 204. With the conversion module 206 generating the debugging information capable of being transmitted through the bus 204, the conversion process ensures that the converted debugging information can meet a requirement of the DMI protocol format, so that the converted debugging information may be transmitted through the DMI line.

In the embodiments of the present disclosure, the conversion module may be a Debug Transport Module (DTM).

It should be noted that all modules included in the chiplet may be arranged independently or in a combined manner in the embodiments of the present disclosure, which is not limited herein. For example, the external interface 205 of the chiplet 200 and the conversion module 206 may be arranged independently or in a combined manner.

Figure 3:
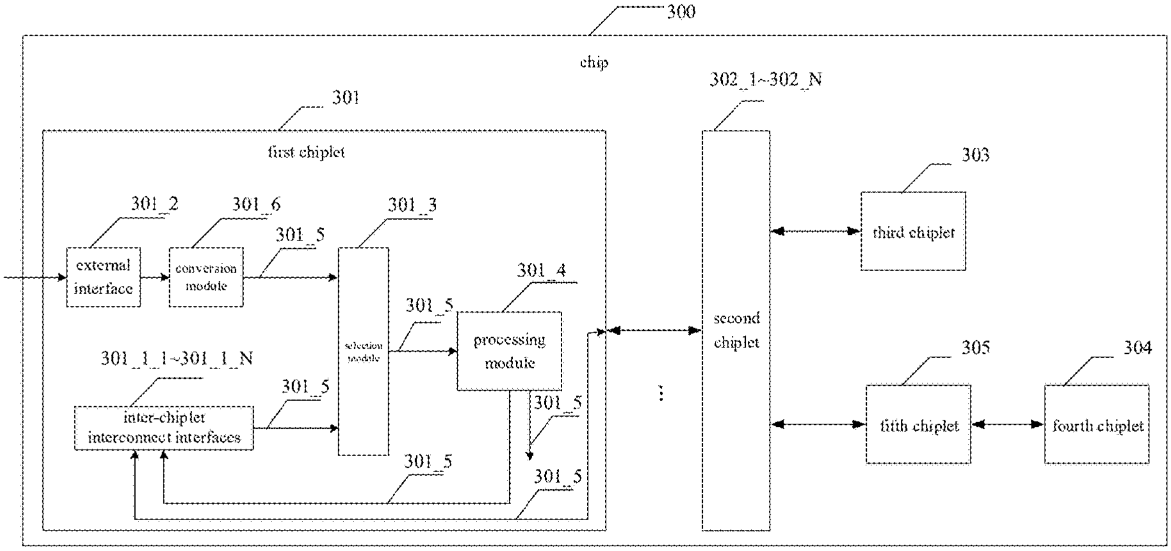
FIG. 3 is a schematic structural diagram of a chip according to an embodiment of the present disclosure.

In a second aspect, referring to FIG. 3 which is a schematic structural diagram of a chip according to an embodiment of the present disclosure, a chip 300 is a chiplet-architecture chip, and includes: a first chiplet 301 and one or more second chiplets 302_1 to 302_N.

In the embodiments of the present disclosure, 302_*i* denotes any second chiplet, where a value of i is from 1 to N, and N is an integer greater than or equal to 1.

It should be noted that concepts or implementations in the second aspect that are the same as those in the first aspect may be found in descriptions of the first aspect, and thus will not be repeated in the second aspect.

In the embodiments of the present disclosure, the first chiplet 301 includes one or more inter-chiplet interconnect interfaces 301_1_1 to 301_1_N respectively corresponding to each second chiplet 302_*i*, each second chiplet 302_*i* includes a respective inter-chiplet interconnect interface, the inter-chiplet interconnect interface of each second chiplet 302_*i* is connected to a corresponding inter-chiplet interconnect interface of the first chiplet 301 for communication between the first chiplet 301 and each second chiplet 302_*i*.

In the embodiments of the present disclosure, the chip 300 includes an external interface 301_2 located on the first chiplet 301, and the external interface 301_2 is configured to be connected to an external debugging device for receiving first debugging information from the external debugging device.

In the embodiments of the present disclosure, the first chiplet 301 further includes a selection module 301_3 and a processing module 301_4.

In the embodiments of the present disclosure, the selection module 301_3 of the first chiplet 301 is connected to the external interface 301_2, and is configured to receive the first debugging information which is received by the external interface 301_2 from the external debugging device, and send the first debugging information to the processing module 301_4 of the first chiplet 301.

In some embodiments, the selection module 301_3 of the first chiplet 301, the one or more inter-chiplet interconnect interfaces 301_1_1 to 301_1_N of the first chiplet 301, and the processing module 301_4 of the first chiplet 301 are connected to each other through a bus 301_5.

In some embodiments, the first chiplet 301 further includes a conversion module 301_6, the selection module 301_3 of the first chiplet 301 is connected to the external interface 301_2 via the conversion module 301_6, the conversion module 301_6 is connected to the selection module 301_3 of the first chiplet 301 through the bus 301_5, and the conversion module 301_6 is configured to receive the first debugging information received by the external interface 301_2, convert the first debugging information into a format suitable for transmission through the bus 301_5, and send the converted first debugging information to the selection module 301_3 of the first chiplet 301 through the bus 301_5.

In the embodiments of the present disclosure, the processing module 301_4 of the first chiplet 301 is connected to the selection module 301_3 of the first chiplet 301 and the one or more inter-chiplet interconnect interfaces 301_1_1 to 301_1_N of the first chiplet 301, and is configured to forward, in a case where it is determined that the first debugging information is debugging information for debugging of the first chiplet 301, the first debugging information within the first chiplet 301 for the debugging of the first chiplet 301, and send, in a case where it is determined that the first debugging information is debugging information for debugging of one second chiplet 302_*i* of the one or more second chiplets 302_1 to 302_N, the first debugging information to an inter-chiplet interconnect interface corresponding to the second chiplet 302_*i* of the one or more inter-chiplet interconnect interfaces 301_1_1 to 301_1_N of the first chiplet 301, so as to send the first debugging information to the second chiplet 302_*i* for the debugging of the second chiplet 302_*i*.

In the embodiments of the present disclosure, the processing module 301_4 may forward the first debugging information within the first chiplet 301 through the bus 301_5 for the debugging of the first chiplet 301.

In the embodiments of the present disclosure, the chiplets in the chip may be connected to each other through at least one inter-chiplet interconnect interface, and interaction of the debugging information between the chiplets which are in communication connection may be realized through at least one inter-chiplet interconnect interface, which expands an acquisition manner of the debugging information and improves transmission reliability of the debugging information, so that the influence of the single point of failure may be reduced or even eliminated. In addition, the chip provided in the present disclosure does not adopt the "JTAG daisy chain", so that a problem of signal integrity can be avoided, additional wiring dedicated to a debugging path is not needed, and complexity and cost of the wiring may be reduced; and interconnection and debugging of chiplets in any number and any topological structure may be supported theoretically, and thus high expandability may be realized. Moreover, the chiplet-architecture chip provided in the present disclosure may merely package one group of inter-chip interconnect interfaces, any chiplet of the chiplet-architecture chip may be accessed through the inter-chip interconnect interfaces, and interaction of the debugging information between adjacent chiplets may be realized through the inter-chip interconnect interfaces between the chiplets, so as to achieve debugging of all chiplets.

In some embodiments, the processing module 301_4 of the first chiplet 301 is configured to determine, in a case wherein it is determined that the first debugging information is debugging information for debugging of one second chiplet 302_*i* of the one or more second chiplets 302_1 to 302_N, an inter-core interconnect interface corresponding to the second chiplet 302_*i* of the one or more inter-chiplet interconnect interfaces 301_1_1 to 301_1_N of the first chiplet 301 according to configuration information, and send the first debugging information to the inter-chiplet interconnect interface corresponding to the second chiplet 302_*i* of the one or more inter-chiplet interconnect interfaces 301_1 to 301_1_N of the first chiplet 301, the configuration information includes connection relationship information of the first chiplet 301 and the one or more second chiplets 302_1 to 302_N and/or information generated based on the connection relationship information.

In the embodiments of the present disclosure, the connection relationship information of the chiplets may be configured to determine a connection path between the chiplets. For example, the connection relationship information of the chiplets may include direct connection information or indirect connection information, the direct connection information may include inter-chiplet interconnect interface information of directly connected chiplets, and the indirect connection information may include inter-chiplet interconnect interface information of chiplets on the connection path.

In some embodiments, each second chiplet 302_*i* further includes a selection module and a processing module; the selection module of each second chiplet 302_*i* is connected to the inter-chiplet interconnect interface of the second chiplet 302_*i*, and is configured to receive the first debugging information from the first chiplet 301 and send the first debugging information to the processing module of the second chiplet 302_*i*; and the processing module of each second chiplet 302_*i* is connected to the selection module of the second chiplet 302_*i* and the inter-chiplet interconnect interface of the second chiplet 302_*i*, and is configured to forward, in a case where it is determined that the first debugging information is debugging information for debugging of the second chiplet 302_*i*, the first debugging information within the second chiplet 302_*i* for the debugging of the second chiplet 302_*i*.

In the embodiments of the present disclosure, the processing module of each second chiplet 302_*i* may forward the first debugging information within the second chiplet 302_*i* through a bus for the debugging of the second chiplet 302_*i*.

In some embodiments, the selection module of the second chiplet 302_*i* and the inter-chiplet interconnect interface of the second chiplet 302_*i* are connected to each other through the bus; and the one or more inter-chiplet interconnect interfaces 301_1_1 to 301_1_N of the first chiplet 301 are connected to the inter-chiplet interconnect interface of the second chiplet 302_*i* through the bus.

In some embodiments, the selection module of the first chiplet 301 further includes one or more second ports connected to the one or more inter-chiplet interconnect interfaces 301_1_1 to 301_1_N of the first chiplet 301, and the one or more second ports are configured to be in a disabled state.

In some embodiments, each second chiplet 302_*i* further includes one or more inter-chiplet interconnect interfaces connected to other chiplets than the first chiplet 301, the selection module of each second chiplet 302_*i* further includes one or more second ports connected to the one or more inter-chiplet interconnect interfaces connected to the other chiplets than the first chiplet 301, and the one or more second ports of the selection module of each second chiplet 302_*i* are configured to be in a disabled state.

In the embodiments of the present disclosure, a port being in a disabled state refers to that the port is in a state that data transmission is not allowed, and the port in the disabled state is not available for reception or transmission of data.

In some embodiments, the chip 300 further includes a third chiplet 303, and the third chiplet 303 includes an inter-chiplet interconnect interface configured to be connected to an inter-chiplet interconnect interface of one corresponding second chiplet 302_*i* to communicate with the second chiplet 302_*i*.

The processing module 301_4 of the first chiplet 301 is further configured to send, in a case where it is determined that the first debugging information is debugging information for debugging of the third chiplet 303, the first debugging information to an inter-chiplet interconnect interface corresponding to the second chiplet 302_*i* connected to the third chiplet 303 of the one or more inter-chiplet interconnect interfaces 301_1_1 to 301_1_N of the first chiplet 301.

The processing module of the second chiplet 302_*i* connected to the third chiplet 303 is further configured to send, in the case where it is determined that the first debugging information is the debugging information for the debugging of the third chiplet 303, the first debugging information to the inter-chiplet interconnect interface corresponding to the third chiplet 303 of the second chiplet 302_*i*, so as to send the first debugging information to the third chiplet 303 for the debugging of the third chiplet 303.

In some embodiments, the chip 300 further includes a fourth chiplet 304 and a fifth chiplet 305, the fourth chiplet 304 includes an inter-chiplet interconnect interface, the fifth chiplet 305 includes an inter-chiplet interconnect interface connected to the second chiplet 302_*i* and an inter-chiplet interconnect interface connected to the fourth chiplet 304, the inter-chiplet interconnect interface of the fourth chiplet 304 is connected to an inter-chiplet interconnect interface of one corresponding second chiplet 302_*i* via the inter-chiplet interconnect interface of the fifth chiplet 305 to communicate with the second chiplet 302_*i*.

The processing module 301_4 of the first chiplet 301 is further configured to send, in a case where it is determined that the first debugging information is debugging information for debugging of the fourth chiplet 304, the first debugging information to an inter-chiplet interconnect interface corresponding to the second chiplet 302_*i* connected to the fifth chiplet 305 of the one or more inter-chiplet interconnect interfaces 301_1_1 to 301_1_N of the first chiplet 301.

The processing module of the second chiplet 302_*i* connected to the fifth chiplet 305 is further configured to send, in the case where it is determined that the first debugging information is the debugging information for the debugging of the fourth chiplet 304, the first debugging information to an inter-chiplet interconnect interface corresponding to the fifth chiplet 305 of the second chiplet 302_*i*, so as to send the first debugging information to the fifth chiplet 305.

The fifth chiplet 305 further includes a selection module and a processing module.

The selection module of the fifth chiplet 305 is connected to the inter-chiplet interconnect interfaces of the fifth chiplet 305, and is configured to receive the first debugging information from the second chiplet 302_*i* and send the first debugging information to the processing module of the fifth chiplet 305.

The processing module of the fifth chiplet 305 is connected to the selection module of the fifth chiplet 305 and the inter-chiplet interconnect interfaces of the fifth chiplet 305, and is configured to forward, in a case where it is determined that the first debugging information is debugging information for debugging of the fifth chiplet 305, the first debugging information within the fifth chiplet 305 for the debugging of the fifth chiplet 305, and send, in the case where it is determined that the first debugging information is the debugging information for the debugging of the fourth chiplet 304, the first debugging information to the inter-chiplet interconnect interface corresponding to the fourth chiplet 304, so as to send the first debugging information to the fourth chiplet 304 for the debugging of the fourth chiplet 304.

In the embodiments of the present disclosure, the processing module of the fifth chiplet 305 may forward the first debugging information within the fifth chiplet 305 through a bus for the debugging of the fifth chiplet 305.

Figure 4:
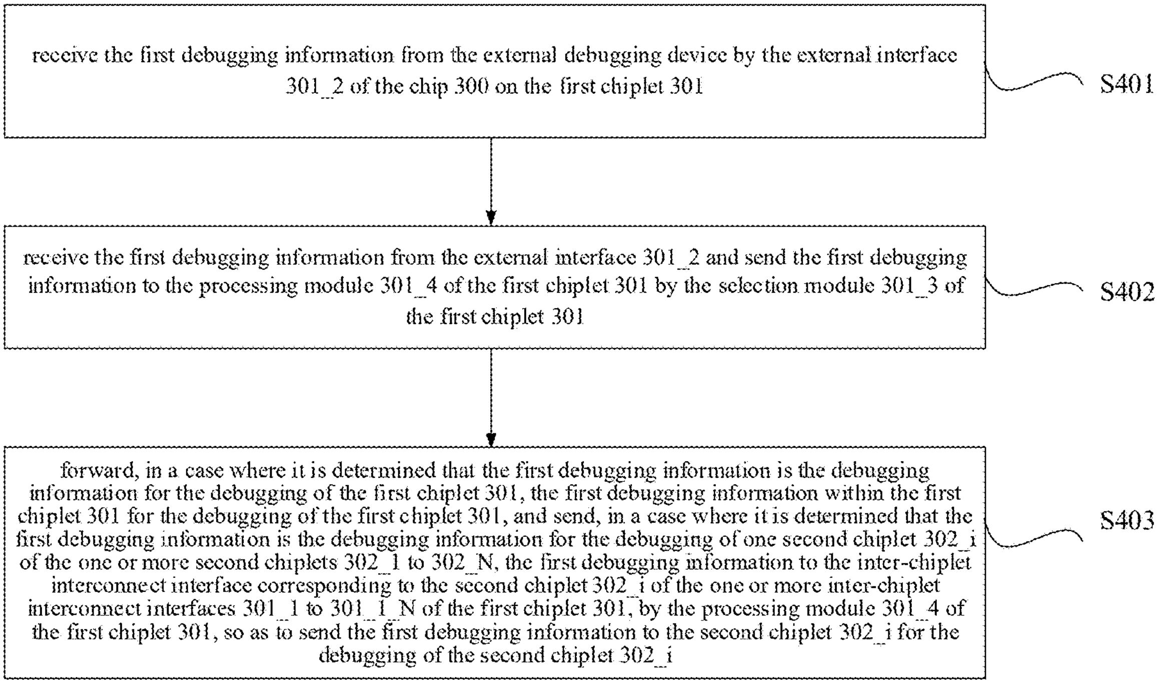
FIG. 4 is a flowchart of a chip debugging method according to an embodiment of the present disclosure.

In a third aspect, referring to FIG. 4 which is a flowchart illustrating a chip debugging method according to an embodiment of the present disclosure, and the chip debugging method is applicable to debugging of the chip 300 provided in the second aspect or in any possible embodiment in the second aspect. The method includes the following operations S401 to S403.

At S401, the first debugging information from the external debugging device is received by the external interface 301_2 of the chip 300 on the first chiplet 301.

At S402, the first debugging information from the external interface 301_2 is received and is sent to the processing module 301_4 of the first chiplet 301 by the selection module 301_3 of the first chiplet 301.

In some embodiments, the method further includes: receiving the first debugging information received by the external interface 301_2, converting the first debugging information into the format suitable for transmission through the bus 301_5, and sending the converted first debugging information to the selection module 301_3 of the first chiplet 301 through the bus 301_5, by the conversion module 301_6 of the first chiplet 301.

At S403, forwarding, in a case where it is determined that the first debugging information is the debugging information for the debugging of the first chiplet 301, the first debugging information within the first chiplet 301 for the debugging of the first chiplet 301, and sending, in a case where it is determined that the first debugging information is the debugging information for the debugging of one second chiplet 302_*i* of the one or more second chiplets 302_1 to 302_N, the first debugging information to the inter-chiplet interconnect interface corresponding to the second chiplet 302_*i* of the one or more inter-chiplet interconnect interfaces 301_1 to 301_1_N of the first chiplet 301, by the processing module 301_4 of the first chiplet 301, so as to send the first debugging information to the second chiplet 302_*i* for the debugging of the second chiplet 302_*i*.

In the embodiments of the present disclosure, the chiplets in the chip may be connected to each other through at least one inter-chiplet interconnect interface, and interaction of the debugging information between the chiplets which are in communication connection may be realized through at least one inter-chiplet interconnect interface, which expands an acquisition manner of the debugging information and improves transmission reliability of the debugging information, so that the influence of the single point of failure may be reduced or even eliminated. In addition, the chip provided in the present disclosure does not adopt the "JTAG daisy chain", so that a problem of signal integrity can be avoided, additional wiring dedicated to a debugging path is not needed, and complexity and cost of the wiring may be reduced; and interconnection and debugging of chiplets in any number and any topological structure may be supported theoretically, and thus high expandability may be realized. Moreover, the chiplet-architecture chip provided in the present disclosure may merely package one group of inter-chip interconnect interfaces, any chiplet of the chiplet-architecture chip may be accessed through the inter-chip interconnect interfaces, and interaction of the debugging information between adjacent chiplets may be realized through the inter-chip interconnect interfaces between the chiplets, so as to achieve debugging of all chiplets.

It should be noted that concepts or implementations in the third aspect that are the same as those in the first aspect or the second aspect may be found in descriptions of the first aspect or the second aspect, and thus will not be repeated in the third aspect.

In some embodiments, the method further includes: receiving the first debugging information from the first chiplet 301 and sending the first debugging information to the processing module of the second chiplet 302_*i* by the selection module of each second chiplet 302_*i*; and forwarding, in a case where it is determined that the first debugging information is the debugging information for the debugging of the second chiplet 302_*i*, the first debugging information within the second chiplet 302_*i* for the debugging of the second chiplet, by the processing module of each second chiplet 302_*i*.

In some embodiments, the method further includes: sending, in the case where it is determined that the first debugging information is the debugging information for the debugging of the third chiplet 303, the first debugging information to the inter-chiplet interconnect interface corresponding to the second chiplet 302_*i* connected to the third chiplet 303 of the one or more inter-chiplet interconnect interfaces 301_1_1 to 301_1_N of the first chiplet 301, by the processing module 301_4 of the first chiplet 301; and sending, in the case where it is determined that the first debugging information is the debugging information for the debugging of the third chiplet 303, the first debugging information to the inter-chiplet interconnect interface corresponding to the third chiplet 303 of the second chiplet 302_*i*, by the processing module of the second chiplet 302_*i* connected to the third chiplet 303, so as to send the first debugging information to the third chiplet 303 for the debugging of the third chiplet 303.

In some embodiments, the method further includes: sending, in the case where it is determined that the first debugging information is the debugging information for the debugging of the fourth chiplet 304, the first debugging information to the inter-chiplet interconnect interface corresponding to the second chiplet 302_*i* connected to the fifth chiplet 305 of the one or more inter-chiplet interconnect interfaces 301_1_1 to 301_1_N of the first chiplet 301, by the processing module 301_4 of the first chiplet 301; sending, in the case where it is determined that the first debugging information is the debugging information for the debugging of the fourth chiplet 304, the first debugging information to the inter-chiplet interconnect interface corresponding to the fifth chiplet 305 of the second chiplet 302_*i*, by the processing module of the second chiplet 302_*i* connected to the fifth chiplet 305, so as to send the first debugging information to the fifth chiplet 305; receiving the first debugging information from the second chiplet 302_*i* and sending the first debugging information to the processing module of the fifth chiplet 305 by the selection module of the fifth chiplet 305; and forwarding, in the case where it is determined that the first debugging information is the debugging information for the debugging of the fifth chiplet 305, the first debugging information within the fifth chiplet 305 for the debugging of the fifth chiplet 305, and sending, in the case where it is determined that the first debugging information is the debugging information for the debugging of the fourth chiplet 304, the first debugging information to the inter-chiplet interconnect interface corresponding to the fourth chiplet 304 of the fifth chiplet 305, by the processing module of the fifth chiplet 305, so as to send the first debugging information to the fourth chiplet 304 for the debugging of the fourth chiplet 304.

In some embodiments, the method further includes: determining, in the case wherein it is determined that the first debugging information is the debugging information for the debugging of one second chiplet 302_*i* of the one or more second chiplets 302_1 to 302_N, the inter-core interconnect interface corresponding to the second chiplet 302_*i* of the one or more inter-chiplet interconnect interfaces 301_1_1 to 301_1_N of the first chiplet 301 according to configuration information, and sending the first debugging information to the inter-chiplet interconnect interface corresponding to the second chiplet 302_*i* of the one or more inter-chiplet interconnect interfaces 301_1 to 301_1_N of the first chiplet 301, by the processing module 301_4 of the first chiplet 301, the configuration information includes the connection relationship information of the first chiplet 301 and the one or more second chiplets 302_1 to 302_N and/or the information generated based on the connection relationship information.

In the embodiments of the present disclosure, application of the chiplet architecture in a baseband chip and the CPU chip covers a wide scenario from wireless communication devices (e.g., base stations and terminal devices), Internet of Things (IoT) devices, and wireless access points to data centers, high performance computing, enterprise applications, and edge computing. Through modular design and independent optimization design, the chip adopting the chiplet architecture meets requirements of high performance, low power consumption, flexible expansion, and high reliability, and provides powerful technical support for modern communication and computing equipment. For example, the chip adopting the chiplet architecture may be applied to a scenario of high-performance computing and data center, in which when the chip adopting the chiplet architecture is applied to a server and a supercomputing node, by independently designing different modules (such as a multi-core processor, a memory controller, and an I/O interface) with multi-chip architecture, the chip adopting the chiplet architecture can provide excellent computing capacity and data processing capacity in the high-performance computing and data center, and the chip debugging method provided in the present disclosure may ensure cooperative operation of all chiplets in a complex system, support flexible resource expansion, and improve overall performance and reliability; and when the chip adopting the chiplet architecture is applied to a cloud computing and virtualization node, the chip adopting the chiplet architecture may achieve higher computing density and efficiency, assist in detecting and optimizing each functional module, and ensure efficient operation of virtualization technology. For example, the chip adopting the chiplet architecture may be applied in a mobile communication scenario, in which when the chip adopting the chiplet architecture is applied to a mobile communication device, the baseband chip needs to be process complex communication protocols, such as 4G, 5G, Wi-Fi, Bluetooth and the like, the chip and the chip debugging method provided in the present disclosure may assist the chip adopting the chiplet architecture in allowing for independent optimization and upgrading of processing modules (such as a modem, a radio frequency front end, and a protocol processor) having different communication standards, and provide communication capability with high efficiency and low power consumption. For example, the chip adopting the chiplet architecture may be applied to a scenario of the IoT and edge computing, in which when the chip adopting the chiplet architecture is applied to a smart city and industrial IoT, the chip adopting the chiplet architecture may be used for data acquisition and edge computing, and the chip debugging method provided in the present disclosure may ensure accuracy and efficiency of each data processing module; and when the chip adopting the chiplet architecture is applied to a home IoT device, the chip and the chip debugging method provided in the present disclosure may assist in ensuring normal operations of all functions of smart home devices (e.g., a smart door lock and a surveillance camera).

In order to enable those of ordinary skill in the art to understand the technical solutions provided in the embodiments of the present disclosure clearer, the technical solutions provided in the embodiments of the present disclosure are further illustrated below by specific embodiments.

Figure 5:
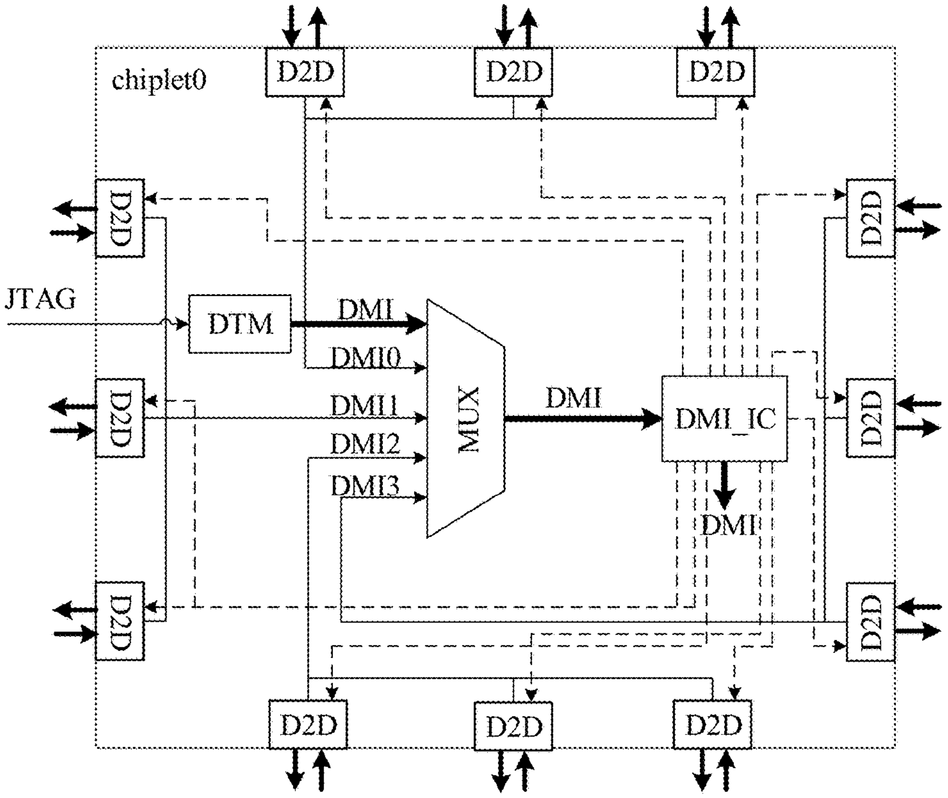
FIG. 5 is another schematic structural diagram of a chiplet according to an embodiment of the present disclosure.

Referring to FIG. 5 which is another schematic structural diagram of a chiplet according to an embodiment of the present disclosure, in the present embodiment, the chiplet is chiplet0, the external interface is the JTAG interface, the conversion module is the DTM, the selection module is the MUX, the inter-chiplet interconnect interfaces are a plurality of groups of bidirectional D2D high-speed interconnect interfaces, the processing module is the DMI_IC module, the bus is the DMI line, and the above modules may perform the following functions.

The JTAG interface is configured to receive the first debugging information from the external debugging device.

The DTM is connected to the MUX through the DMI line, and is configured to receive the first debugging information from the external debugging device via the JTAG interface, and convert the first debugging information into a format suitable for transmission through the DMI line;

The plurality of groups of bidirectional D2D high-speed interconnect interfaces (abbreviated to D2D in the drawings) are connected to the MUX and the DMI_IC through the DMI line, and are configured to receive a plurality of pieces of second debugging information from a plurality of other chiplets (e.g., chiplets adjacent to the chiplet0) through the DMI line;

The MUX is configured to receive at least one piece of debugging information of the first debugging information having converted format from the DTM and the second debugging information from the plurality of groups of bidirectional D2D high-speed interconnect interfaces, and send the at least one piece of debugging information to the DMI_IC, and FIG. 5 illustrate an example that the at least one piece of debugging information is the debugging information received from the DTM.

The DMI_IC is configured to forward, in a case where it is determined that the debugging information received from the MUX is debugging information for debugging of the chiplet0 (i.e., the current chiplet), the debugging information received from the MUX within the chiplet0 for the debugging of the chiplet0, and send, in a case where it is determined that the debugging information received from the MUX is debugging information for debugging of another chiplet, the debugging information received from the MUX to a bidirectional D2D high-speed interconnect interface corresponding to the another chip, so as to send the debugging information to the another chip through the bidirectional D2D high-speed interconnect interface for the debugging of the another chip based on the debugging information received through the bidirectional D2D high-speed interconnect interface.

Figure 6:
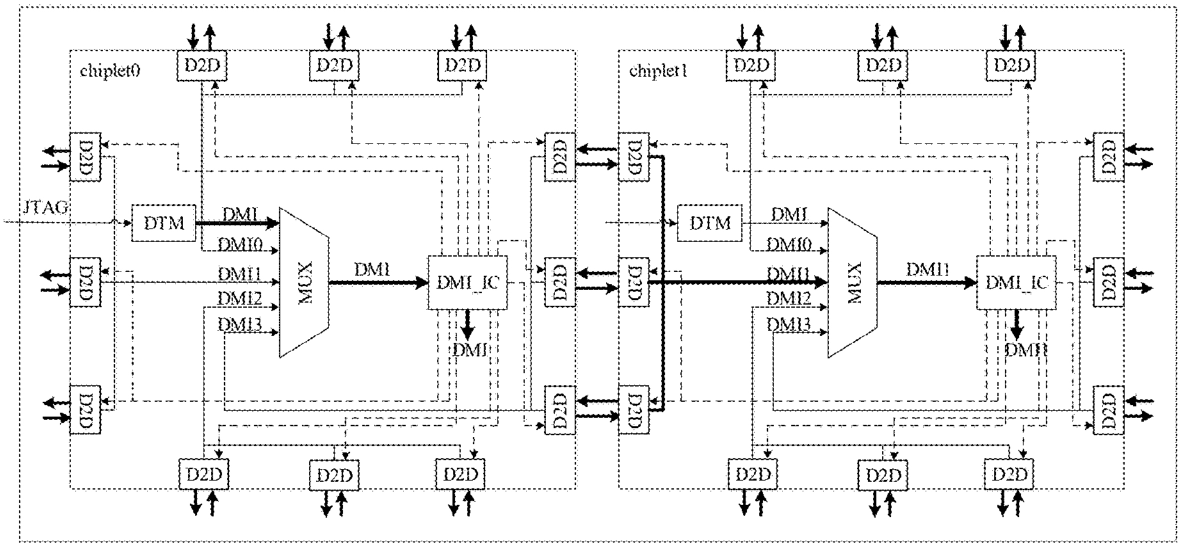
FIG. 6 is another schematic structural diagram of a chip according to an embodiment of the present disclosure.

Referring to FIG. 6 which is another schematic structural diagram of a chip according to an embodiment of the present disclosure, the chip shown in FIG. 6 includes two chiplets, which are chiplet0 and chiplet1 respectively, structure of each chiplet shown in FIG. 6 is the same as that of the chiplet shown in FIG. 5, and components included in each chiplet shown in FIG. 6 and functions thereof are the same as those of the chiplet shown in FIG. 5, and thus will not be repeated here. Differences between each chiplet shown in FIG. 6 and the chiplet shown in FIG. 5 are described below.

In the present embodiment, the following chip debugging method including operations S61-S64*b* may be implemented based on the chip shown in FIG. 6.

At S61, the first debugging information from the external debugging device is received by the JTAG interface located on the chiplet0.

At S62, the first debugging information received from the external debugging device by the JTAG interface is converted by the DTM of the chiplet0 into the debugging information suitable for transmission through the DMI line.

At S63, the debugging information having converted format is received from the DTM and is sent to the DMI_IC of the chiplet0 by the MUX of the chiplet0.

At S64*a*, in the case where it is determined by the DMI_IC that the debugging information received from the MUX is the debugging information for the debugging of the chiplet0 (i.e., the current chiplet), the debugging information received from the MUX is forwarded within the chiplet0 for the debugging of the chiplet0.

At S64*b*, in a case where it is determined that the debugging information received from the MUX is debugging information for debugging of the chiplet1, the debugging information received from the MUX is sent to a bidirectional D2D high-speed interconnect interface corresponding to the chiplet1, so as to send the debugging information to the corresponding chiplet1 through the bidirectional D2D high-speed interconnect interface; and the MUX of the chiplet1 is configured to select the debugging information output through DMI1 (connected to a bidirectional D2D high-speed interconnect interface corresponding to the chiplet0) as the debugging information for the chiplet1 (see the bold line), so as to enable the chiplet1 to perform the debugging based on the debugging information received through the DMI1.

Figure 7:
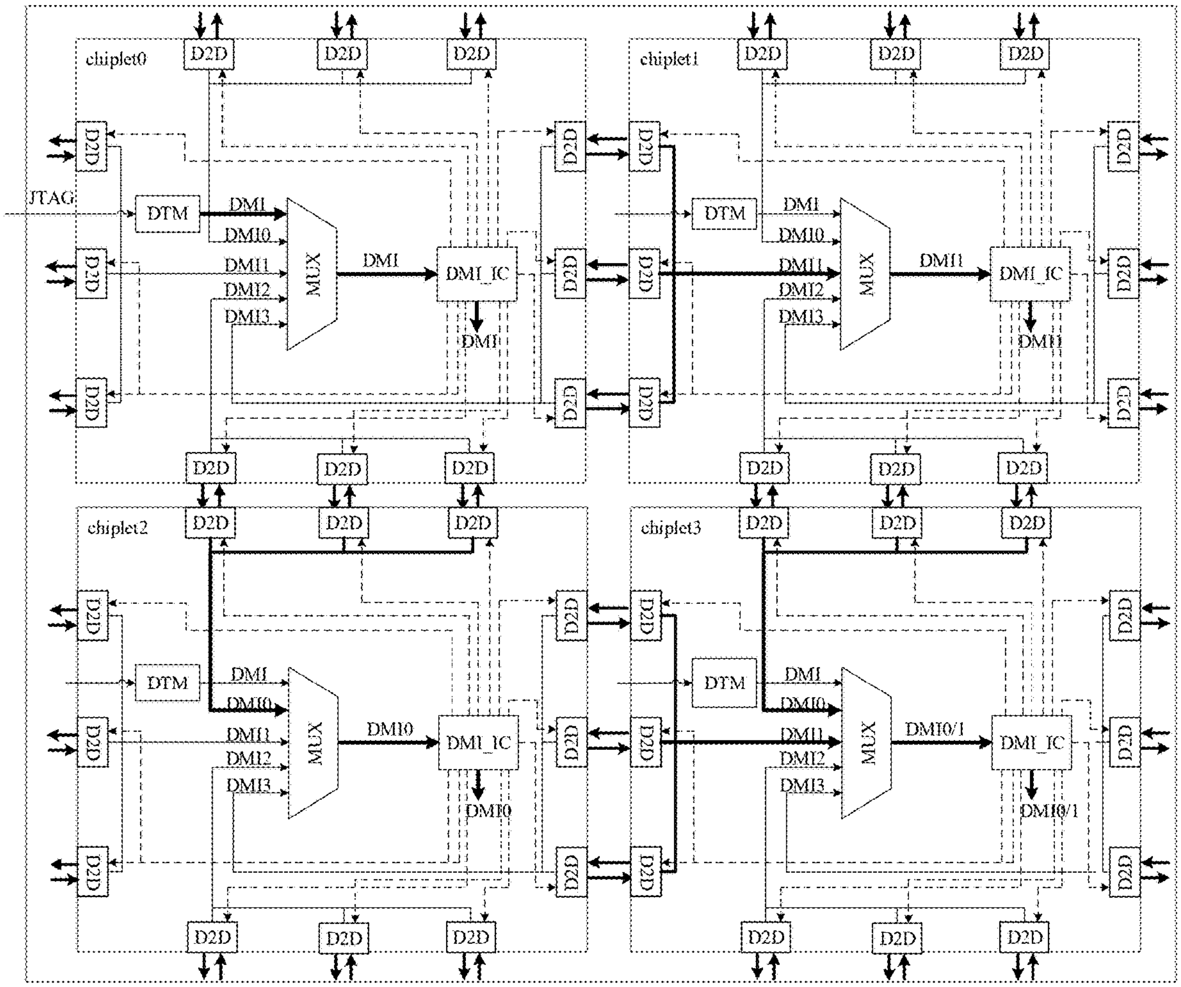
FIG. 7 is still another schematic structural diagram of a chip according to an embodiment of the present disclosure.

Referring to FIG. 7 which is still another schematic structural diagram of a chip according to an embodiment of the present disclosure, the chip shown in FIG. 7 includes four chiplets, which are chiplet0, chiplet1, chiplet2, and chiplet3 respectively, structure of each chiplet shown in FIG. 7 is the same as that of the chiplet shown in FIG. 5, and components included in each chiplet shown in FIG. 7 and functions thereof are the same as those of the chiplet shown in FIG. 5, and thus will not be repeated here. The differences between each chiplet shown in FIG. 7 and the chiplet shown in FIG. 5 are described below.

In the present embodiment, the following chip debugging method including operations S71-S74*d* may be implemented based on the chip shown in FIG. 7.

At S71, the debugging information from the external debugging device is received by the JTAG interface located on the chiplet0.

At S72, the first debugging information received from the external debugging device by the JTAG interface is converted by the DTM of the chiplet0 into the debugging information suitable for transmission through the DMI line.

At S73, the debugging information having converted format is received from the DTM and is sent to the DMI_IC of the chiplet0 by the MUX of the chiplet0.

At S74*a*, in the case where it is determined by the DMI_IC that the debugging information received from the MUX is the debugging information for the debugging of the chiplet0 (i.e., the current chiplet), the debugging information received from the MUX is forwarded within the chiplet0 for the debugging of the chiplet0.

At S74*b*, in the case where it is determined that the debugging information received from the MUX is the debugging information for the debugging of the chiplet1, the debugging information received from the MUX is sent to the bidirectional D2D high-speed interconnect interface corresponding to the chiplet1 so as to send the debugging information to the corresponding chiplet1 through the bidirectional D2D high-speed interconnect interface, and the MUX of the chiplet1 is configured to select the debugging information output through the DMI1 (connected to the bidirectional D2D high-speed interconnect interface corresponding to the chiplet0) as the debugging information for the chiplet1 (see the bold line), so as to enable the chiplet1 to perform the debugging based on the debugging information received through the DMI1.

At S74*c*: in a case where it is determined that the debugging information received from the MUX is debugging information for debugging of the chiplet2, the debugging information received from the MUX is sent to a bidirectional D2D high-speed interconnect interface corresponding to the chiplet2 so as to send the debugging information to the corresponding chiplet2 through the bidirectional D2D high-speed interconnect interface, and the MUX of the chiplet2 is configured to select the debugging information output through DMI0 (connected to the bidirectional D2D high-speed interconnect interface corresponding to the chiplet0) as the debugging information for the chiplet2 (see the bold line), so as to enable the chiplet2 to perform the debugging based on the debugging information received through the DMI0.

At S74*d*: in a case where it is determined that the debugging information received from the MUX is debugging information for debugging of the chiplet 3, the debugging information received from the MUX is sent to the bidirectional D2D high-speed interconnect interface corresponding to the chiplet1 or the chiplet2 connected to the chiplet3 so as to send the debugging information to the corresponding chiplet3 through the bidirectional D2D high-speed interconnect interface, and the MUX of the chiplet3 is configured to select the debugging information output through DMI0 (connected to a bidirectional D2D high-speed interconnect interface corresponding to the chiplet1) or DMI1 (connected to a bidirectional D2D high-speed interconnect interface corresponding to the chiplet2) as the debugging information for the chiplet3 (see the bold lines), so as to enable the chiplet3 to perform the debugging based on the debugging information received through the DMI0 or the DMI1.

Figure 8:
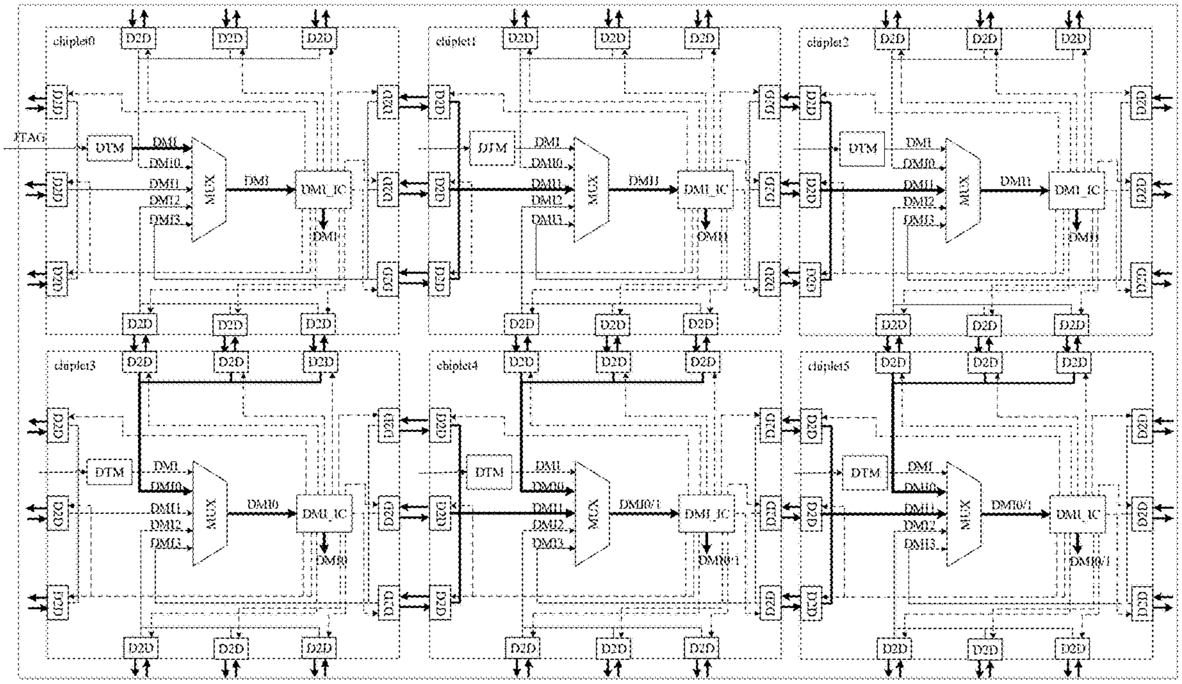
FIG. 8 is still another schematic structural diagram of a chip according to an embodiment of the present disclosure.

Referring to FIG. 8 which is still another schematic structural diagram of a chip according to an embodiment of the present disclosure, the chip shown in FIG. 8 includes six chiplets, which are chiplet0, chiplet1, chiplet2, chiplet3, chiplet4, and chiplet5 respectively, structure of each chiplet shown in FIG. 8 is the same as that of the chiplet shown in FIG. 5, and components included in each chiplet shown in FIG. 8 and functions thereof are the same as those of the chiplet shown in FIG. 5, and thus will not be repeated here. The differences between each chiplet shown in FIG. 8 and the chiplet shown in FIG. 5 are described below.

In the present embodiment, the following chip debugging method including operations S81-S84*f* may be implemented based on the chip shown in FIG. 8.

At S81, the debugging information from the external debugging device is received by the JTAG interface located on the chiplet0.

At S82, the first debugging information received from the external debugging device by the JTAG interface is converted by the DTM of the chiplet0 into the debugging information suitable for transmission through the DMI line.

At S83, the debugging information having converted format is received from the DTM and is sent to the DMI_IC of the chiplet0 by the MUX of the chiplet0.

At S84*a*, in the case where it is determined by the DMI_IC that the debugging information received from the MUX is the debugging information for the debugging of the chiplet0 (i.e., the current chiplet), the debugging information received from the MUX is forwarded within the chiplet0 for the debugging of the chiplet0.

At S84*b*, in the case where it is determined that the debugging information received from the MUX is the debugging information for the debugging of the chiplet1, the debugging information received from the MUX is sent to the bidirectional D2D high-speed interconnect interface corresponding to the chiplet1 so as to send the debugging information to the corresponding chiplet1 through the bidirectional D2D high-speed interconnect interface, and the MUX of the chiplet1 is configured to select the debugging information output through the DMI1 (connected to the bidirectional D2D high-speed interconnect interface corresponding to the chiplet0) as the debugging information for the chiplet1 (see the bold line), so as to enable the chiplet1 to perform the debugging based on the debugging information received through the DMI1.

At S84*c*, in the case where it is determined that the debugging information received from the MUX is the debugging information for the debugging of the chiplet 3, the debugging information received from the MUX is sent to the bidirectional D2D high-speed interconnect interface corresponding to the chiplet3 so as to send the debugging information to the corresponding chiplet3 through the bidirectional D2D high-speed interconnect interface, and the MUX of the chiplet3 is configured to select the debugging information output through DMI0 (connected to a bidirectional D2D high-speed interconnect interface corresponding to the chiplet0) as the debugging information for the chiplet3 (see the bold line), so as to enable the chiplet3 to perform the debugging based on the debugging information received through the DMI0.

At S84*d*, in the case where it is determined that the debugging information received from the MUX is the debugging information for the debugging of the chiplet2, the debugging information received from the MUX is sent to a bidirectional D2D high-speed interconnect interface corresponding to the chiplet1 connected to the chiplet2 so as to send the debugging information to the corresponding chiplet2 through the bidirectional D2D high-speed interconnect interface, and the MUX of the chiplet2 is configured to select the debugging information output through DMI1 (connected to a bidirectional D2D high-speed interconnect interface corresponding to the chiplet1) as the debugging information for the chiplet2 (see the bold line), so as to enable the chiplet2 to perform the debugging based on the debugging information received through the DMI1. It should be noted that the debugging information may also be transmitted to the chiplet2 through a path of chiplet0-chiplet3-chiplet4-chiplet5-chiplet2 when a failure occurs in a path of chiplet0-chiplet1-chiplet2, and a manner of transmitting the debugging information through the path of chiplet0-chiplet3-chiplet4-chiplet5-chiplet2 is similar to the manner of transmitting the debugging information through the path of chiplet0-chiplet1-chiplet2, and thus will not be repeated here.

At S84*e*, in a case where it is determined that the debugging information received from the MUX is debugging information for debugging of the chiplet4, the debugging information received from the MUX is sent to the bidirectional D2D high-speed interconnect interface corresponding to the chiplet1 connected to the chiplet4 or the bidirectional D2D high-speed interconnect interface corresponding to the chiplet3 connected to the chiplet4 so as to send the debugging information to the corresponding chiplet4 through either bidirectional D2D high-speed interconnect interface, and the MUX of the chiplet4 is configured to select the debugging information output through DMI0 (connected to a bidirectional D2D high-speed interconnect interface corresponding to the chiplet1) or DMI1 (connected to a bidirectional D2D high-speed interconnect interface corresponding to the chiplet3) as the debugging information for the chiplet4 (see the bold lines), so as to enable the chiplet4 to perform the debugging based on the debugging information received through the DMI0 or the DMI1.

At S84*f*, in a case where it is determined that the debugging information received from the MUX is debugging information for debugging of the chiplet5, the debugging information received from the MUX is sent to a bidirectional D2D high-speed interconnect interface corresponding to the chiplet1 connected to the chiplet2 or the chiplet4 connected to the chiplet5 or a bidirectional D2D high-speed interconnect interface corresponding to the chiplet3 connected to the chiplet4 connected to the chiplet5, so as to send the debugging information to the corresponding chiplet5 through either bidirectional D2D high-speed interconnect interface, and the MUX of the chiplet5 is configured to select the debugging information output through DMI0 (connected to a bidirectional D2D high-speed interconnect interface corresponding to the chiplet2) or DMI1 (connected to a bidirectional D2D high-speed interconnect interface corresponding to the chiplet4) as the debugging information for the chiplet5 (see the bold lines), so as to enable the chiplet5 to perform the debugging based on the debugging information received through the DMI0 or the DMI1.

In the above embodiment, the external JTAG interface may be connected to any chiplet included in the chip, thereby implementing debugging access to all chiplets. The adjacent chiplets communicate with each other through the D2D modules, and when the D2D module between any two chiplets is blocked, the debugging may be still initiated through another interconnected chiplet. For example, when the D2D module between the chiplet0 and the chiplet1 is blocked, the debugging of the chiplet3 may be initiated through the D2D modules from the chiplet1 to the chiplet3. Thus, the reliability of the debugging path is greatly improved, and the influence of the single point of failure on the debugging of the chip may be reduced or even eliminated. By adopting the chip and the chip debugging method provided in the present disclosure, the debugging information may be transmitted step by step among a plurality of chiplets, and debugging of the chip adopting the chip architecture in any number and any topological structure may be realized.

In a fourth aspect, an embodiment of the present disclosure further provides a computer readable medium having stored thereon a computer program which, when executed by a processor, implements the third aspect and any possible embodiment in the third aspect.

It should be understood by those of ordinary skill in the art that the functional modules/units in all or some of the operations, the systems and the devices disclosed above may be implemented as software, firmware, hardware, or suitable combinations thereof.

If implemented as hardware, the division between the functional modules/units stated above is not necessarily corresponding to the division of physical components; and for example, one physical component may include a plurality of functions, or one function or operation may be performed through cooperation of several physical components.

Some or all of the physical components may be implemented as software executed by a processor, such as a CPU, a digital signal processor or a microprocessor, or may be implemented as hardware, or may be implemented as an integrated circuit, such as an application specific integrated circuit. Such software may be distributed on a computer-readable medium, which may include a computer storage medium (or a non-transitory medium) and a communication medium (or a transitory medium). As well known by those of ordinary skill in the art, the term "computer storage medium" includes volatile/nonvolatile and removable/non-removable media used in any method or technology for storing information (such as computer-readable instructions, data structures, program modules and other data). The computer storage medium includes, but is not limited to, a Random Access Memory (RAM, more specifically, a Synchronous Dynamic RAM (SDRAM), a Double Data Rate SDRAM (DDR SDRAM), etc.), a Read Only Memory (ROM), an Electrically Erasable Programmable Read-Only Memory (EEPROM), a flash memory (FLASH) or other magnetic storage devices; a Compact Disc Read Only Memory (CD-ROM), a Digital Versatile Disc (DVD) or other optical discs; a magnetic cassette, a magnetic tape, a magnetic disk or other magnetic storage devices; and any other medium which can be configured to store desired information and can be accessed by a computer. In addition, it is well known by those of ordinary skill in the art that the communication media generally include computer-readable instructions, data structures, program modules, or other data in modulated data signals such as carrier wave or other transmission mechanism, and may include any information delivery medium.

The present disclosure discloses the exemplary embodiments using specific terms, but the terms are merely used and should be merely interpreted as having general illustrative meanings, rather than for the purpose of limitation. Unless expressly stated, it is apparent to those of ordinary skill in the art that features, characteristics and/or elements described in connection with a particular embodiment can be used alone or in combination with features, characteristics and/or elements described in connection with other embodiments. Therefore, it should be understood by those of ordinary skill in the art that various changes in the forms and the details can be made without departing from the scope of the present disclosure of the appended claims.

What is claimed is:

1. A chiplet, comprising at least one inter-chiplet interconnect interface connected to at least one other chiplet to communicate with the at least one other chiplet, a selection module connected to the at least one inter-chiplet interconnect interface, and a processing module connected to the selection module, wherein, the at least one inter-chiplet interconnect interface is configured to receive second debugging information from the at least one other chiplet;

the selection module is configured to receive at least one piece of debugging information of the second debugging information from an inter-chiplet interconnect interface, connected to a corresponding one other chiplet of the at least one other chiplet, of the at least one inter-chiplet interconnect interface, and send the at least one piece of debugging information to the processing module; and the processing module is configured to forward, upon determining that the at least one piece of debugging information is debugging information for debugging of the chiplet, the at least one piece of debugging information within the chiplet for the debugging of the chiplet, and send, upon determining that the at least one piece of debugging information is debugging information for debugging of a target chiplet which is different from the corresponding one other chiplet of the at least one other chiplet, the at least one piece of debugging information to an inter-chiplet interconnect interface corresponding to the target chiplet of the at least one inter-chiplet interconnect interface, so as to send the at least one piece of debugging information to the target chiplet via the inter-chiplet interconnect interface corresponding to the target chiplet.

2. The chiplet of claim 1, wherein the selection module, the at least one inter-chiplet interconnect interface, and the processing module are connected to each other through a bus.

3. The chiplet of claim 2, further comprising a conversion module, wherein the selection module is connected to external interface via the conversion module, and the conversion module is connected to the selection module through the bus; and the conversion module is configured to receive the first debugging information from the external interface, convert the first debugging information into a format suitable for transmission through the bus, and send the converted first debugging information to the selection module through the bus.

4. The chiplet of claim 2, wherein the bus is a Debug Module Interface (DMI) line.

5. The chiplet of claim 1, wherein the selection module comprises at least one second port configured to receive the second debugging information, each of the at least one second port corresponds to one of the at least one other chiplet, each of the at least one other chiplet is connected to one or more inter-chiplet interconnect interfaces of the at least one inter-chiplet interconnect interface of the chiplet, and the one or more inter-chiplet interconnect interfaces are connected to the second port corresponding to each of the at least one other chiplet for sending the second debugging information from a corresponding one of the at least one other chiplet to the corresponding second port.

6. The chiplet of claim 1, wherein the processing module is configured to determine, upon determining that the at least one piece of debugging information is debugging information for debugging of the target chiplet of the at least one other chiplet, the inter-chiplet interconnect interface corresponding to the target chiplet of the at least one inter-chiplet interconnect interface of the chiplet according to configuration information, and send the at least one piece of debugging information to the corresponding inter-chiplet interconnect interface, and the configuration information comprises connection relationship information of the chiplet and the at least one other chiplet and/or information generated based on the connection relationship information.

7. The chiplet of claim 1, wherein each of the at least one inter-chiplet interconnect interface is connected to a corresponding one of the at least one other chiplet, and comprises at least two bidirectional transmission interface units; and each of the at least two bidirectional transmission interface units is configured to receive the second debugging information from the corresponding one other chiplet, and is further configured to transmit the at least one piece of debugging information to the target chiplet.

8. The chiplet of claim 1, wherein the external interface is any one of a Joint Test Action Group (JTAG) interface, a USB interface, an Ethernet interface, a Serial Peripheral Interface (SPI), or a Universal Asynchronous Receiver-Transmitter (UART) interface.

9. The chiplet of claim 1, wherein the debugging information comprises debugging data and/or a debugging instruction.

10. A chip, comprising a first chiplet and one or more second chiplets, wherein, the first chiplet comprises one or more inter-chiplet interconnect interfaces respectively corresponding to each of the second chiplets, each of the second chiplets comprises a respective inter-chiplet interconnect interface, the respective inter-chiplet interconnect interface of each of the second chiplets is connected to a corresponding inter-chiplet interconnect interface of the first chiplet for communication between the first chiplet and each of the second chiplets;

the chip comprises an external interface located on the first chiplet, and the external interface is connected to an external debugging device for receiving first debugging information from the external debugging device;

the first chiplet further comprises a selection module and a processing module, the selection module of the first chiplet is connected to the external interface, and is configured to receive the first debugging information and send the first debugging information to the processing module of the first chiplet;

the processing module of the first chiplet is connected to the selection module of the first chiplet and the one or more inter-chiplet interconnect interfaces of the first chiplet, and is configured to forward, upon determining that the first debugging information is debugging information for debugging of the first chiplet, the first debugging information within the first chiplet for the debugging of the first chiplet, and send, upon determining that the first debugging information is debugging information for debugging of one second chiplet of the one or more second chiplets, the first debugging information to an inter-chiplet interconnect interface corresponding to the one second chiplet of the one or more inter-chiplet interconnect interfaces of the first chiplet, so as to send the first debugging information to the one second chiplet for the debugging of the one second chiplet, and wherein each of the second chiplets further comprises a selection module and a processing module, wherein:

the selection module of each of the second chiplets is connected to the inter-chiplet interconnect interface of the second chiplet, and is configured to receive the first debugging information from the first chiplet and send the first debugging information to the processing module of the second chiplet; and the processing module of each of the second chiplets is connected to the selection module of the second chiplet and the inter-chiplet interconnect interface of the second chiplet, and is configured to forward, upon determining that the first debugging information is debugging information for debugging of the second chiplet, the first debugging information within the second chiplet for the debugging of the second chiplet, wherein the chiplet further comprises a third chiplet, wherein the third chiplet comprises an inter-chiplet interconnect interface connected to a corresponding inter-chiplet interconnect interface of one of the second chiplets to communicate with the one second chiplet, the processing module of the first chiplet is further configured to send, upon determining that the first debugging information is debugging information for debugging of the third chiplet, the first debugging information to an inter-chiplet interconnect interface corresponding to the one second chiplet connected to the third chiplet of the one or more inter-chiplet interconnect interfaces of the first chiplet; and the processing module of the one second chiplet connected to the third chiplet is further configured to send, in the case where it is determined that the first debugging information is the debugging information for the debugging of the third chiplet, the first debugging information to the inter-chiplet interconnect interface corresponding to the third chiplet of the one second chiplet, so as to send the first debugging information to the third chiplet for the debugging of the third chiplet.

11. The chip of claim 10, wherein the selection module of the first chiplet, the one or more inter-chiplet interconnect interfaces of the first chiplet, and the processing module of the first chiplet are connected to each other through a bus; a selection module of each of the second chiplets and the inter-inter-chiplet interconnect interface of each of the second chiplets are connected to each other through a bus; and the one or more inter-chiplet interconnect interfaces of the first chiplet are connected to the inter-chiplet interconnect interface of each of the second chiplets through a bus.

12. The chip of claim 11, wherein the first chiplet further comprises a conversion module, the selection module of the first chiplet is connected to the external interface via the conversion module, the conversion module is connected to the selection module of the first chiplet through the bus, and the conversion module is configured to receive the first debugging information received by the external interface, convert the first debugging information into a format suitable for transmission through the bus, and send the converted first debugging information to the selection module of the first chiplet through the bus.

13. The chip of claim 10, wherein the selection module of the first chiplet further comprises one or more second ports connected to the one or more inter-chiplet interconnect interfaces of the first chiplet, and the one or more second ports are configured to be in a disabled state.

14. The chip of claim 10, wherein each of the second chiplets further comprises one or more inter-chiplet interconnect interfaces connected to other chiplets than the first chiplet, a selection module of each of the second chiplets further comprises one or more second ports connected to the one or more inter-chiplet interconnect interfaces connected to the other chiplets than the first chiplet, and the one or more second ports of the selection module of each of the second chiplets are configured to be in a disabled state.

15. The chip of claim 10, further comprising a fourth chiplet and a fifth chiplet, wherein the fourth chiplet comprises an inter-chiplet interconnect interface, the fifth chiplet comprises an inter-chiplet interconnect interface connected to one of the second chiplets and an inter-chiplet interconnect interface connected to the fourth chiplet, the inter-chiplet interconnect interface of the fourth chiplet is connected to a corresponding inter-chiplet interconnect interface of the one second chiplet via the inter-chiplet interconnect interface connected to the one second chiplet of the fifth chiplet to communicate with the one second chiplet, the processing module of the first chiplet is further configured to send, upon determining that the first debugging information is debugging information for debugging of the fourth chiplet, the first debugging information to an inter-chiplet interconnect interface corresponding to the one second chiplet connected to the fifth chiplet of the one or more inter-chiplet interconnect interfaces of the first chiplet;

the processing module of the one second chiplet connected to the fifth chiplet is further configured to send, in the case where it is determined that the first debugging information is the debugging information for the debugging of the fourth chiplet, the first debugging information to an inter-chiplet interconnect interface corresponding to the fifth chiplet of the one second chiplet, so as to send the first debugging information to the fifth chiplet;

the fifth chiplet further comprises a selection module and a processing module, the selection module of the fifth chiplet is connected to the inter-chiplet interconnect interfaces of the fifth chiplet, and is configured to receive the first debugging information from the one second chiplet and send the first debugging information to the processing module of the fifth chiplet; and the processing module of the fifth chiplet is connected to the selection module of the fifth chiplet and the inter-chiplet interconnect interfaces of the fifth chiplet, and is configured to forward, upon determining that the first debugging information is debugging information for debugging of the fifth chiplet, the first debugging information within the fifth chiplet for the debugging of the fifth chiplet, and send, in the case where it is determined that the first debugging information is the debugging information for the debugging of the fourth chiplet, the first debugging information to the inter-chiplet interconnect interface connected to the fourth chiplet of the fifth chiplet, so as to send the first debugging information to the fourth chiplet for the debugging of the fourth chiplet.

16. The chip of claim 10, wherein the processing module of the first chiplet is configured to determine, upon determining that the first debugging information is debugging information for the debugging of the one second chiplet of the one or more second chiplets, an inter-core interconnect interface corresponding to the one second chiplet of the one or more inter-chiplet interconnect interfaces of the first chiplet according to configuration information, and send the first debugging information to the inter-chiplet interconnect interface corresponding to the one second chiplet of the one or more inter-chiplet interconnect interfaces of the first chiplet, and the configuration information comprises connection relationship information of the first chiplet and the one or more second chiplets and/or information generated based on the connection relationship information.

17. A chip debugging method applied to the chip of claim 10, comprising:

receiving the first debugging information from the external debugging device by the external interface of the chip on the first chiplet;

receiving the first debugging information from the external interface and sending the first debugging information to the processing module of the first chiplet by the selection module of the first chiplet;

forwarding, upon determining that the first debugging information is the debugging information for the debugging of the first chiplet, the first debugging information within the first chiplet for the debugging of the first chiplet, and sending, upon determining that the first debugging information is the debugging information for the debugging of the one second chiplet of the one or more second chiplets, the first debugging information to the inter-chiplet interconnect interface corresponding to the one second chiplet of the one or more inter-chiplet interconnect interfaces of the first chiplet, by the processing module of the first chiplet, so as to send the first debugging information to the one second chiplet for the debugging of the one second chiplet; and by a selection module of each of the second chiplets, receiving the first debugging information from the first chiplet, and sending the first debugging information to a processing module of the second chiplet; and by a processing module of each of the second chiplets, forwarding, upon determining that the first debugging information is debugging information for debugging of the second chiplet, the first debugging information within the second chiplet for the debugging of the second chiplet.

18. The method of claim 17, further comprising:

by a conversion module of the first chiplet, receiving the first debugging information received by the external interface, converting the first debugging information into a format suitable for transmission through a bus, and sending the converted first debugging information to the selection module of the first chiplet through the bus.

19. The method of claim 17, further comprising:

by the processing module of the first chiplet, sending, upon determining that the first debugging information is debugging information for debugging of a third chiplet, the first debugging information to an inter-chiplet interconnect interface corresponding to one of the second chiplets connected to the third chiplet of the one or more inter-chiplet interconnect interfaces of the first chiplet; and by a processing module of the one second chiplet connected to the third chiplet, sending, in the case where it is determined that the first debugging information is the debugging information for the debugging of the third chiplet, the first debugging information to an inter-chiplet interconnect interface corresponding to the third chiplet of the one second chiplet, so as to send the first debugging information to the third chiplet for the debugging of the third chiplet.

* * * * *